United States Patent
Hara

(10) Patent No.: US 9,256,264 B2
(45) Date of Patent: Feb. 9, 2016

(54) INFORMATION PROCESSING DEVICE AND METHOD FOR DRIVING THE SAME

(71) Applicant: Semiconductor Energy Laboratory Co., Ltd., Atsugi-shi, Kanagawa-ken (JP)

(72) Inventor: Yutaka Hara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 295 days.

(21) Appl. No.: 13/920,147

(22) Filed: Jun. 18, 2013

(65) Prior Publication Data

US 2013/0346780 A1     Dec. 26, 2013

(30) Foreign Application Priority Data

Jun. 22, 2012    (JP) ................ 2012-140616

(51) Int. Cl.

| G06F 1/32 | (2006.01) |
|---|---|
| G06F 9/44 | (2006.01) |
| H01L 27/115 | (2006.01) |
| H01L 29/786 | (2006.01) |
| H01L 27/12 | (2006.01) |

(52) U.S. Cl.
CPC .............. *G06F 1/32* (2013.01); *G06F 1/3225* (2013.01); *G06F 1/3275* (2013.01); *G06F 9/4418* (2013.01); *H01L 27/115* (2013.01); *H01L 27/1225* (2013.01); *H01L 29/7869* (2013.01); *Y02B 60/1228* (2013.01); *Y02B 60/186* (2013.01); *Y02B 60/32* (2013.01)

(58) Field of Classification Search
CPC ....... G06F 1/32; G06F 1/3225; G06F 1/3275; G06F 9/4418
See application file for complete search history.

(56) References Cited

U.S. PATENT DOCUMENTS

| 5,528,032 | A | 6/1996 | Uchiyama | |
|---|---|---|---|---|
| 7,523,269 | B2 * | 4/2009 | Panabaker et al. | 711/147 |
| 8,413,146 | B1 * | 4/2013 | McCorkendale et al. | 718/1 |
| 8,489,799 | B2 * | 7/2013 | Factor et al. | 711/6 |
| 9,037,547 | B1 * | 5/2015 | Shivdeo | 707/664 |

FOREIGN PATENT DOCUMENTS

| JP | 06-051858 A | 2/1994 |
|---|---|---|
| JP | 06-275697 A | 9/1994 |
| JP | 2008-158773 A | 7/2008 |
| JP | 2011-192194 A | 9/2011 |

* cited by examiner

*Primary Examiner* — Stefan Stoynov

(74) *Attorney, Agent, or Firm* — Fish & Richardson P.C.

(57) ABSTRACT

Hibernation/resume time is reduced, and a low-power information processing device and a method for driving the information processing device are provided. In an information processing device in which a virtual environment is created, in hibernation during which part of a main storage unit is stopped while data in the main storage unit is retained, data stored in the main storage unit is saved to a non-volatile memory, and whether another data shares a common block with the data saved to the non-volatile memory is determined in hibernation during which part of the main storage unit is stopped while the other data in the main storage unit is retained. In the case where there is a common block, the common block of the other data is not saved to the non-volatile memory, and the information on the common block is retained in the non-volatile memory.

12 Claims, 6 Drawing Sheets

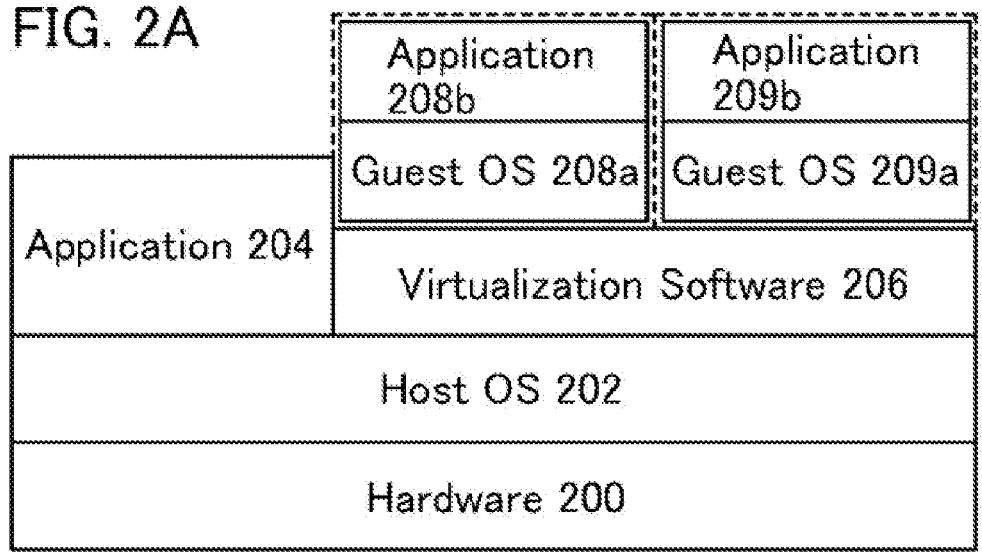
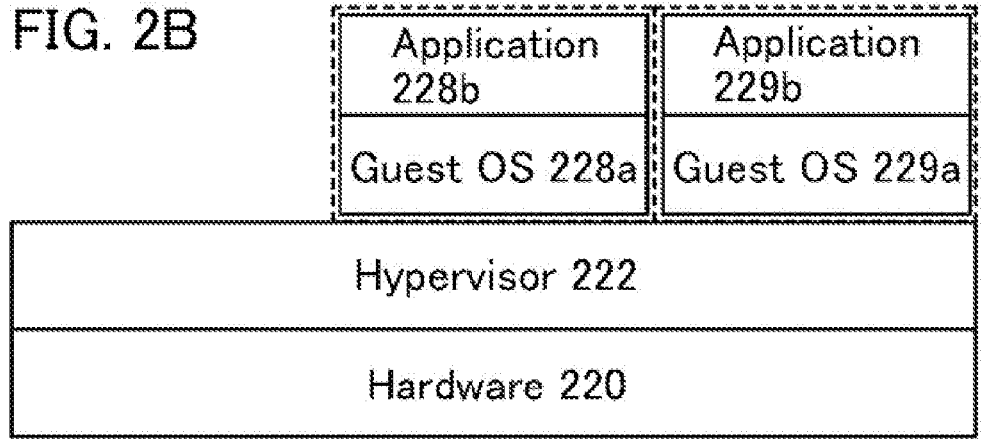

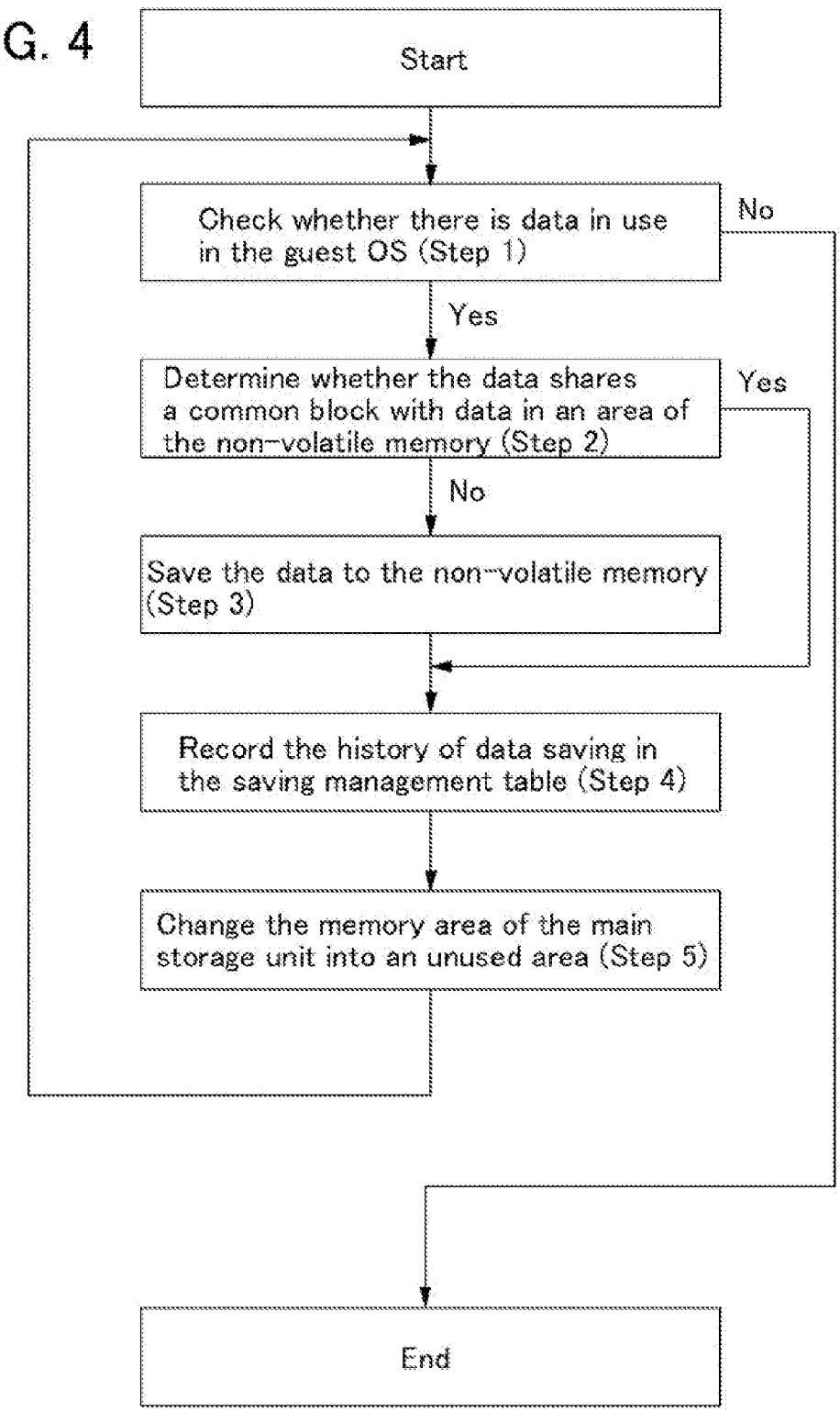

INFORMATION PROCESSING DEVICE AND METHOD FOR DRIVING THE SAME

BACKGROUND OF THE INVENTION

1. Field of the Invention

The present invention relates to an information processing device.

2. Description of the Related Art

In recent years, a data center, a computer room, and the like contain a large number of closely spaced information processing devices. Since the power consumed by the information processing devices is converted into heat, their operation needs improved air conditioning systems, and uninterruptible power supply (UPS) also needs to be improved for the information processing devices and the air conditioning systems, leading to more power consumption. Thus, power consumption as low as possible has been required for efficient use of power in the data center or the computer room.

Power consumption has also increased with an increase in the performance of information processing devices. The following technique (resume system) has been disclosed in view of this: when a program is interrupted and resumed, a program execution state is saved to a non-volatile secondary storage device, whereby execution can be resumed even after power supply to an information processing device is stopped and the execution of a program is temporarily interrupted (see Patent Document 1).

Another technique is disclosed in Patent Document 2: a virtual environment is created so that one information processing device is logically divided as if there were plural information processing devices, which enables a reduction in power consumption and efficient use of hardware resources.

REFERENCES

Patent Documents

[Patent Document 1] Japanese Published Patent Application No. H6-051858
[Patent Document 2] Japanese Published Patent Application No. 2011-192194

SUMMARY OF THE INVENTION

However, a high-capacity main storage device is necessary for the creation of a virtual environment, which causes a problem in that hibernation/resume time increases with an increase in the amount of data.

An object of one embodiment of the present invention is to reduce hibernation/resume time in an information processing device in which a virtual environment is created. Another object of one embodiment of the present invention is to provide a low-power information processing device and a method for driving the information processing device.

One embodiment of the present invention is an information processing device including an arithmetic processing unit, a main storage unit, a memory management unit, and a secondary storage unit. The main storage unit includes an operating system and the secondary storage unit includes a non-volatile memory. The operating system includes a hibernation utility. The hibernation utility controls saving of data stored in the main storage unit. In hibernation during which part of the main storage unit is stopped while data in the main storage unit is retained, the data stored in the main storage unit is saved to the non-volatile memory. In hibernation during which part of the main storage unit is stopped while another data in the main storage unit is retained, it is determined whether the other data shares a common block with the data saved to the non-volatile memory. In the case where there is a common block, the common block of the other data is not saved to the non-volatile memory, and the information on the common block is retained in the non-volatile memory.

In the above structure of one embodiment of the present invention, the data that is found to have a common block is in a kernel area of the operating system.

In the above structure of one embodiment of the present invention, in resumption for starting part of the main storage unit, the data which has been saved to the non-volatile memory is written back to the main storage unit by the hibernation utility.

In the above structure of one embodiment of the present invention, the data which has been saved to the non-volatile memory is written back to the main storage unit when the data is read from the non-volatile memory and updated.

One embodiment of the present invention is a method for driving an information processing device, including the following steps: saving data stored in a main storage unit to a non-volatile memory in hibernation during which part of the main storage unit is stopped while the data in the main storage unit is retained; and determining whether another data shares a common block with the data saved to the non-volatile memory in hibernation during which part of the main storage unit is stopped while the other data in the main storage unit is retained. In the case where there is a common block, the common block of the other data is not saved to the non-volatile memory, and the information on the common block is retained in the non-volatile memory.

In the above driving method of one embodiment of the present invention, the data that is found to have a common block is in a kernel area of the operating system.

In the above driving method of one embodiment of the present invention, in resumption for starting part of the main storage unit, the data which has been saved to the non-volatile memory is written back to the main storage unit.

In the above driving method of one embodiment of the present invention, the data which has been saved to the non-volatile memory is written back to the main storage unit when the data is read from the non-volatile memory and updated.

According to one embodiment of the present invention, in an information processing device in which a virtual environment is created, hibernation/resume time can be reduced. In addition, a driving method with low power consumption can be provided.

BRIEF DESCRIPTION OF THE DRAWINGS

In the accompanying drawings:

FIGS. 2A and 2B illustrate examples of an information processing device in which a virtual environment is created;

FIG. 4 is a flowchart showing a method for driving an information processing device according to one embodiment of the present invention;

DETAILED DESCRIPTION OF THE INVENTION

Figure 1:
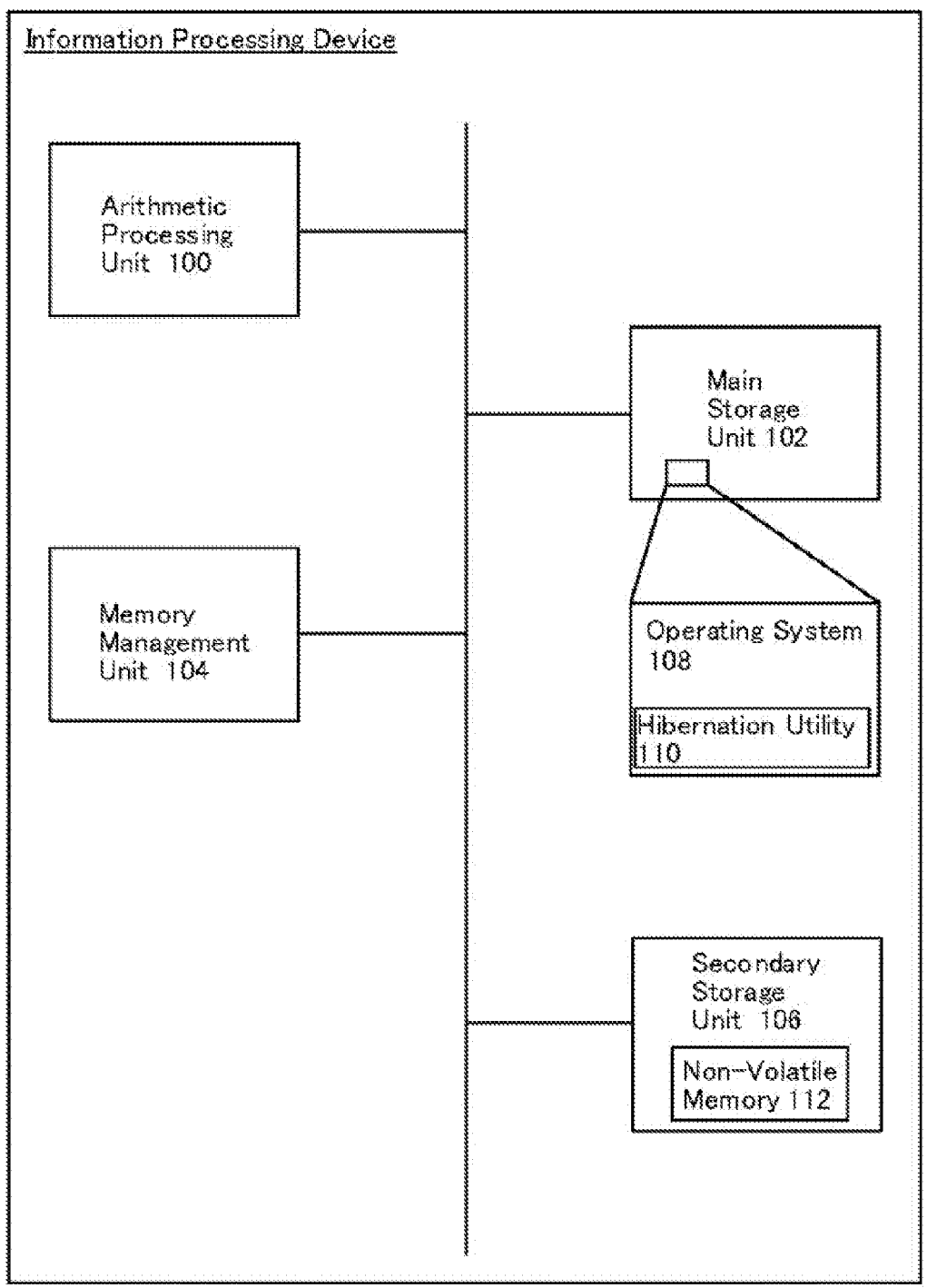
FIG. 1 illustrates an example of a configuration of an information processing device according to one embodiment of the present invention.

Hereinafter, embodiments of the present invention will be described in detail with reference to the accompanying drawings. Note that the present invention is not limited to the description below, and it is easily understood by those skilled in the art that modes and details of the present invention can be modified in various ways without departing from the spirit and scope of the present invention. Accordingly, the present invention should not be construed as being limited to the description of the embodiments below.

Note that the functions of the "source" and "drain" may replace each other in the case, for example, where transistors of different conductivity types are used, or where the direction of a current flow changes in a circuit operation. Therefore, the terms "source" and "drain" can replace each other in this specification.

The meaning of "electrically connected" includes "connected through an object having any electric function". The "object having any electric function" may be any object which allows electric signals to be transmitted and received between the components connected through the object.

The position, size, and area of each component in the drawings and the like are not accurately represented in some cases to facilitate understanding, and thus are not necessarily limited to those in the drawings and the like in the disclosed invention.

The ordinal number such as "first", "second", and "third" are used to avoid confusion among components.

In this specification, the term "parallel" indicates that the angle between two straight lines is greater than or equal to −10° and less than or equal to 10°, and accordingly includes the case where the angle is greater than or equal to −5° and less than or equal to 5°. In addition, the term "perpendicular" indicates that the angle between two straight lines is greater than or equal to 80° and less than or equal to 100°, and accordingly includes the case where the angle is greater than or equal to 85° and less than or equal to 95°.

Embodiment 1

In this embodiment, an information processing device of one embodiment of the present invention and a method for driving the same will be described with reference to drawings.

FIG. 1 is a schematic diagram illustrating an example of a configuration of the information processing device of one embodiment of the present invention. The information processing device in FIG. 1 includes an arithmetic processing unit 100, a main storage unit 102, a memory management unit 104, and a secondary storage unit 106. The main storage unit 102 includes a plurality of operating systems 108 and a plurality of hibernation utilities 110. The secondary storage unit 106 includes a non-volatile memory 112.

The arithmetic processing unit 100 is a central processing unit (CPU) and controls the operation of each unit in the information processing device. The arithmetic processing unit 100 also executes an operating system (also referred to as an OS) loaded in the main storage unit 102 or various programs operating under the OS.

The main storage unit 102 includes a dynamic random access memory (DRAM), a static random access memory (SRAM), or the like. The main storage unit 102 is a volatile storage unit in which data can be temporarily retained while power is supplied.

The memory management unit 104 has a function of processing memory accesses requested by the arithmetic processing unit 100, specifically, translating virtual addresses into physical addresses.

Here, virtual addresses and physical addresses will be described. In the case where the arithmetic processing unit 100 requires a larger memory area than that of the main storage unit 102 in the information processing device, a virtual environment is created so that storage capacity higher than or equal to that of the main storage unit 102 can be utilized. In addition, the operating system makes discontinuous memory areas look as if they are continuous areas when seen from software. An address given virtually at this time is referred to as a virtual address, and an effective address of the actual memory is referred to as a physical address. For example, a physical address "1, 3, 4, 5, 7, 10" is translated into a continuous virtual address "1, 2, 3, 4, 5, 6". In that case, the physical address is mapped to the virtual address in a mapping table.

The hibernation utility 110 controls saving and writing (recovery) of data stored in the main storage unit 102.

There is no particular limitation on the kind of the non-volatile memory 112 as long as data can be retained even when power supply is shut off; for example, it is possible to use a ferroelectric random access memory (FeRAM), a magnetoresistive random access memory (MRAM), a resistance random access memory (ReRAM), a NAND or NOR flash memory, or a phase change random access memory (PRAM). The non-volatile memory 112 can also be a memory including a transistor using an oxide semiconductor material for a semiconductor layer (at least a channel region).

FIGS. 2A and 2B illustrate examples of a configuration of the virtual environment. Virtualization is classified into host OS virtualization and hypervisor virtualization depending on the server configuration.

FIG. 2A illustrates a configuration called a host OS. In the host OS, virtualization software 206 is installed on an OS. An OS installed on hardware 200 is referred to as a host OS 202, and an OS installed on virtualization hardware of the virtualization software 206 is referred to as a guest OS (e.g., a guest OS 208a and a guest OS 209a). An application 204, an application 208b, and an application 209b run on the host OS 202, the guest OS 208a, and the guest OS 209a, respectively.

FIG. 2B illustrates a configuration called a hypervisor. In the hypervisor, virtualization software operates directly via hardware 220. An area directly operating via the hardware 220 is referred to as a hypervisor 222. An OS installed on the hypervisor 222 is referred to as a guest OS (e.g., a guest OS 228a and a guest OS 229a). Like in the host OS, an application 228b and an application 229b run on the guest OS 228a and the guest OS 229a, respectively.

Next, a method for driving the information processing device in which a virtual environment is created will be described with reference to FIGS. 3A to 3C and FIG. 4.

Figure 3A:
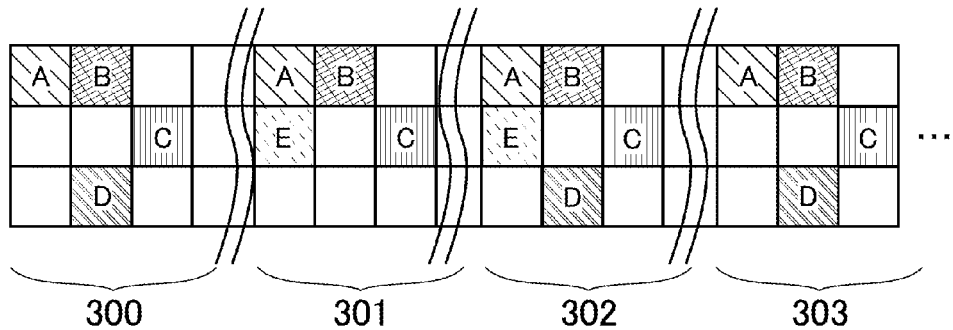
FIGS. 3A to 3C illustrate a method for driving an information processing device according to one embodiment of the present invention.
Figure 3B:
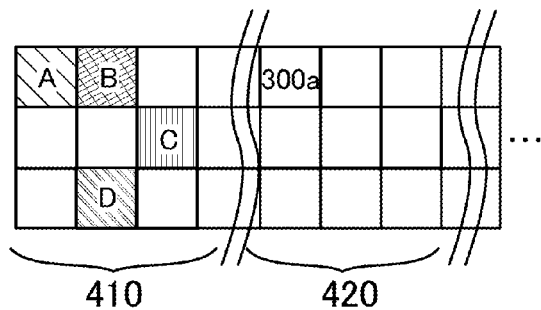
Figure 3C:
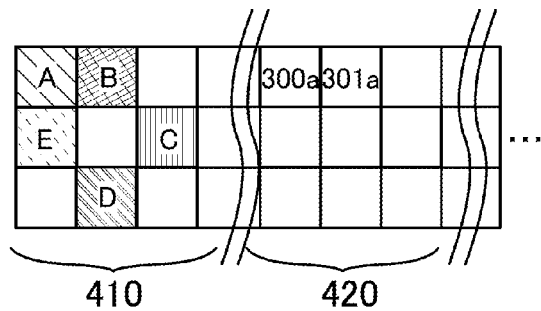

FIGS. 3A to 3C illustrate an example of an information processing device having a host OS. For easy understanding, it is assumed that the main storage unit 102 includes a plurality of guest operating systems (the operating systems 108 illustrated in FIG. 1; in this embodiment, a guest OS 300, a guest OS 301, a guest OS 302, and a guest OS 303) as illustrated in FIG. 3A.

A memory area is assigned to each guest OS in the main storage unit 102. In this embodiment, data "A, B, C, D" is retained in the memory area of the guest OS 300, data "A, B, C, E" is retained in the memory area of the guest OS 301, data "A, B, C, D, E" is retained in the memory area of the guest OS 302, and data "A, B, C, D" is retained in the memory area of the guest OS 303. Note that the data is not necessarily divided into a block "A, B, C, D, E"; for example, the data may be divided into a block of several bits.

An example of the data includes a kernel area which manages a part of an OS closer to hardware.

The kernel area includes a system call interface which has a fundamental function, a kernel code which is independent of the architecture, a board support package which is dependent on the architecture, and the like. A common data block in the kernel area is typically a file, a fixed-length block, a variable-length block, or the like. The variable-length block is also referred to as a chunk or a segment.

For example, when the same file is copied to a file server by several people, there are many files duplicated in the storage. In that case, the common data block is a file.

Also in the case where a system call is divided into plural variable-length blocks on the basis of a data pattern, the system calls in the OS with different versions include many same variable-length blocks; thus, it is effective to eliminate the duplicated blocks of data.

FIG. 4 is a flowchart showing an example of a hibernation process. In hibernation during which the guest OS 300 in the main storage unit 102 is stopped, the hibernation utility 110 checks whether there is data in use in the guest OS 300 (Step 1). If there is data in use (Yes in Step 1), it is determined whether the data shares a common block with data in an area 410 of the non-volatile memory 112 (Step 2).

If there is no common block (No in Step 2), the data in use is saved from a memory area assigned to the guest OS 300 in the main storage unit 102 to the area 410 of the non-volatile memory 112 (Step 3).

In the case where the non-volatile memory 112 has no space left, the content of the data in use can be saved to a secondary storage unit such as a hard disk.

After the data is saved to the non-volatile memory 112 (or the secondary storage unit such as a hard disk), history 300a of data saving is recorded in a saving management table in an area 420 of the non-volatile memory 112 (Step 4, see FIG. 3B).

In this embodiment, the data in use is saved to the area 410 of the non-volatile memory 112, and the history of saved data and the history of common blocks are recorded in the area 420 of the non-volatile memory 112.

What is recorded in the history 300a is the area of the guest OS 300 in which the data "A, B, C, D" has been used until just before the saving. The history allows the data to be restored in the previous area in accordance with the saving management table.

After the saving to the non-volatile memory 112 (or the secondary storage unit such as a hard disk) is completed, the hibernation utility 110 changes the memory area of the main storage unit 102 into an unused area (Step 5); then, the process is repeated from Step 1.

If there is no data in use in Step 1 (No in Step 1), the guest OS 300 is stopped by the hibernation utility 110.

Then, in hibernation during which the guest OS 301 in the main storage unit 102 is stopped, as in the case of the guest OS 300, the hibernation utility 110 checks whether there is data in use in the guest OS 301 (Step 1). If there is data in use (Yes in Step 1), it is determined whether the data shares a common block with data in the area 410 of the non-volatile memory 112 (Step 2).

If there is a common block (Yes in Step 2), the information that the common block (in this embodiment, data "A, B, C") is not saved to the non-volatile memory 112 but is shared is recorded as history 301a in the saving management table in the area 420 of the non-volatile memory 112 (Step 4).

The hibernation utility 110 deems the common block to have been saved to the non-volatile memory 112 (or the secondary storage unit such as a hard disk) (actually, the saving has not been done), and changes the memory area for the common block of the main storage unit 102 into an unused area (Step 5). Then, the process is repeated from Step 1.

The same process is repeated: it is determined whether data in use shares a common block with data in the area 410 of the non-volatile memory 112; if there is no common block (No in Step 2), the data in use (in this embodiment, data "E") is saved from a memory area assigned to the guest OS 301 in the main storage unit 102 to the area 410 of the non-volatile memory 112 (Step 3).

After the data is saved to the non-volatile memory 112 (or the secondary storage unit such as a hard disk), the history 301a of data saving is recorded in the saving management table in the area 420 of the non-volatile memory 112 (Step 4, see FIG. 3C).

The same process is repeated, and if there is no data in use (No in Step 1), the guest OS 301 is stopped by the hibernation utility 110.

The same process is performed also in hibernation during which the guest OS 302 or the guest OS 303 in the main storage unit 102 is stopped. Although not illustrated, data in the guest OS 302 and the guest OS 303 is duplicated with the data that has been saved to the area 410 of the non-volatile memory 112. Accordingly, the information that the common block is not saved to the non-volatile memory 112 but is shared is recorded as history in the saving management table in the area 420 of the non-volatile memory 112.

In this embodiment, not all the area 410 of the non-volatile memory 112 is rewritten, but new data in use is saved to an unused area of the non-volatile memory 112. Also in this embodiment, data in use which is not the same as the data that has been saved to the area 410 of the non-volatile memory 112 is saved in sequence; however, one embodiment of the present invention is not limited to this. The hibernation process may be performed on the gust OS 302, and then performed on the guest OS 300 which includes a smaller amount of data in use than the guest OS 301.

Each piece of data in use is checked to be the same as that stored in the area 410 of the non-volatile memory 112. Thus, the checking speed decreases with an increase in the amount of data stored in the area 410 of the non-volatile memory 112. Therefore, it is preferable that the hibernation process be performed first on a guest OS including a small amount of data in use so that the data is saved.

In a conventional method, data in use in the guest OS 300 to the guest OS 303 in the main storage unit 102 is saved to the non-volatile memory 112 with no change. By employing the above method, it is possible to avoid duplication of data saved to the non-volatile memory 112, resulting in an efficient use of a memory area of the non-volatile memory 112. Further, in hibernation, data which has been stored in the non-volatile memory 112 is referred to and blocks other than those common to the data are saved to the non-volatile memory 112, which leads to a reduction in the amount of data to be saved, an increase in saving speed, and a reduction in power in writing.

In the subsequent resumption for starting the guest OS 300 to the guest OS 303 in the main storage unit 102, on the basis of the history (e.g., the history 300a or the history 301a) recorded in the saving management table in the area 420 of the non-volatile memory 112, the data in the area 410 is read from the non-volatile memory 112 by the hibernation utility 110 (in this embodiment, the data "A, B, C, D" is read for the guest OS 300, the data "A, B, C, E" is read for the guest OS 301, the data "A, B, C, D, E" is read for the guest OS 302, and the data "A, B, C, D" is read for the guest OS 303). The data that has been read is written back to each gust OS, whereby data recovery is completed. When the data in the area 410 is read once, the data can be written to the memory area assigned to the guest OS 300 to the guest OS 303 in the main storage unit 102, which enables high speed recovery with access and low power consumption.

In addition, on the basis of the history recorded in the saving management table in the area 420 of the non-volatile memory 112, the data in the area 410 can be partly read from the non-volatile memory 112 so that the data is updated. For example in resumption for starting the guest OS 300 and the guest OS 301 in the main storage unit 102, on the basis of the history 300a and the history 301a recorded in the area 420 of the non-volatile memory 112, the data in the area 410 is read from the non-volatile memory 112 by the hibernation utility 110 (in this embodiment, the data "A, B, C, D" is read for the guest OS 300 and the data "A, B, C, E" is read for the guest OS 301). After that, the data in the area 410 which has been saved to the non-volatile memory 112 is written back to the memory area assigned to each guest OS in the main storage unit 102, so that the data read in the guest OS 300 is updated.

In such a manner, data can be saved to a non-volatile memory in hibernation while duplication of common blocks is eliminated. Thus, the amount of data to be saved can be reduced, and the saving process can be performed with high speed and low writing power. Furthermore, data can be written to the common blocks when read once in resumption, resulting in high speed recovery with access and low power consumption. That is to say, it is possible to achieve reduction in hibernation/resume time and power consumption.

The structures, methods, and the like shown in this embodiment can be combined with any of those shown in the other embodiments, as appropriate.

Embodiment 2

Described in this embodiment is a structure of a non-volatile memory cell using a transistor including an oxide semiconductor material, which can be used as the non-volatile memory described in the above embodiment.

Figure 5:
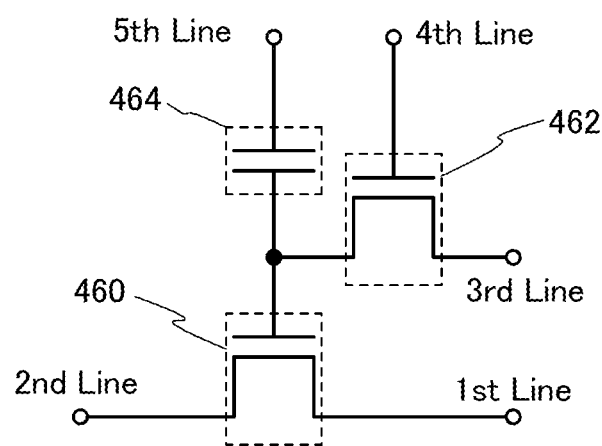
FIG. 5 is a circuit diagram illustrating a structure of a memory cell.

The non-volatile memory cell has the structure illustrated in FIG. 5, for example.

FIG. 5 illustrates an example of the structure of the non-volatile memory cell. A first wiring (1st Line) is electrically connected to a source electrode of a transistor 460, and a second wiring (2nd Line) is electrically connected to a drain electrode of the transistor 460. A third wiring (3rd Line) is electrically connected to a source electrode (or a drain electrode) of a transistor 462, and a fourth wiring (4th Line) is electrically connected to a gate electrode of the transistor 462. A gate electrode of the transistor 460 and a drain electrode (or a source electrode) of the transistor 462 are electrically connected to one electrode of a capacitor 464, and a fifth wiring (5th Line) is electrically connected to the other electrode of the capacitor 464.

The memory cell in FIG. 5 utilizes the characteristics that the potential of the gate electrode of the transistor 460 can be retained, and thus enables data writing, retaining, and reading as follows. Note that an oxide semiconductor is used for an active layer of the transistor 460.

Writing and holding of data will be described. First, the potential of the fourth wiring is set to a potential at which the transistor 462 is turned on, so that the transistor 462 is turned on. Accordingly, the potential of the third wiring is supplied to the gate electrode of the transistor 460 and the capacitor 464. That is, predetermined charge is given to the gate electrode of the transistor 460 (writing). Here, charge for supplying one of two different potentials (hereinafter referred to as a low-level charge and a high-level charge) is given. After that, the potential of the fourth wiring is set to a potential at which the transistor 462 is turned off, so that the transistor 462 is turned off. Thus, the charge given to the gate electrode of the transistor 460 is kept (retaining).

Since the transistor 462 has an extremely low off-state current (leakage current) per channel width of less than or equal to $1 \times 10^{-19}$ A/μm, the charge of the gate electrode of the transistor 460 is retained for a long time.

Next, reading of data will be described. When an appropriate potential (reading potential) is supplied to the fifth wiring while a predetermined potential (constant potential) is supplied to the first wiring, the potential of the second wiring varies depending on the amount of charge stored in the gate electrode of the transistor 460. In general, when the transistor 460 is an n-channel transistor, an apparent threshold voltage $V_{th\_H}$ in the case where a high-level charge is given to the gate electrode of the transistor 460 is lower than an apparent threshold voltage $V_{th\_L}$ in the case where a low-level charge is given to the gate electrode of the transistor 460. Here, an apparent threshold voltage refers to the potential of the fifth wiring, which is needed to turn on the transistor 460. Thus, when the potential of the fifth wiring is set to a potential $V_0$ intermediate between $V_{th\_H}$ and $V_{th\_L}$, charge given to the gate electrode of the transistor 460 can be determined. For example, in the case where a high-level charge is given in writing, the transistor 460 is turned on when the potential of the fifth wiring is set to $V_0$ ($>V_{th\_H}$). In the case where a low-level charge is given in writing, the transistor 460 remains in the off state even when the potential of the fifth wiring is set to $V_0$ ($<V_{th\_L}$). Therefore, the stored data can be read by checking the potential of the second wiring.

Note that in the case where memory cells are arrayed to be used, only data of desired memory cells needs to be read. In the case where data is not read, a potential at which the transistor 460 is turned off regardless of the state of the gate electrode of the transistor 460, that is, a potential lower than $V_{th\_H}$ may be given to the fifth wiring. Alternatively, a potential at which the transistor 460 is turned on regardless of the state of the gate electrode, that is, a potential higher than $V_{th\_L}$ may be supplied to the fifth wiring.

In this embodiment, a transistor having a channel formation region formed using an oxide semiconductor and having extremely low off-state current is employed in the memory cell; accordingly, stored data can be retained for an extremely long period. In other words, power consumption can be adequately reduced because refresh operation becomes unnecessary or the frequency of refresh operation can be extremely low. Moreover, stored data can be retained for a long period even when power is not supplied (note that a potential is preferably fixed).

Further, in the memory cell shown in this embodiment, high voltage is not necessary for writing data and there is no problem of deterioration of elements. For example, unlike in a conventional non-volatile memory, it is not necessary to inject and extract electrons into and from a floating gate; thus, the problem of deterioration of a gate insulating film does not occur. In other words, the semiconductor device according to one embodiment of the present invention does not have a limit on the number of times of writing which is a problem in a conventional non-volatile memory, and reliability thereof is drastically improved. Furthermore, data is written depending on the on state and the off state of the transistor, whereby high-speed operation can be easily achieved.

A transistor using an oxide semiconductor material can be formed using the same apparatus and method as those of a thin film transistor using silicon or the like, resulting in a reduction in the load of new capital investment or the load of a study of the manufacturing method. It can thus be said that a memory cell including a transistor using an oxide semiconductor material for a semiconductor layer (at least a channel region) is one preferable mode of the non-volatile memory.

An example of the structure of the memory cell, which has the circuit structure illustrated in FIG. 5 and includes the transistor using an oxide semiconductor material, will be described with reference to FIGS. 6A to 6C.

Figure 6A:
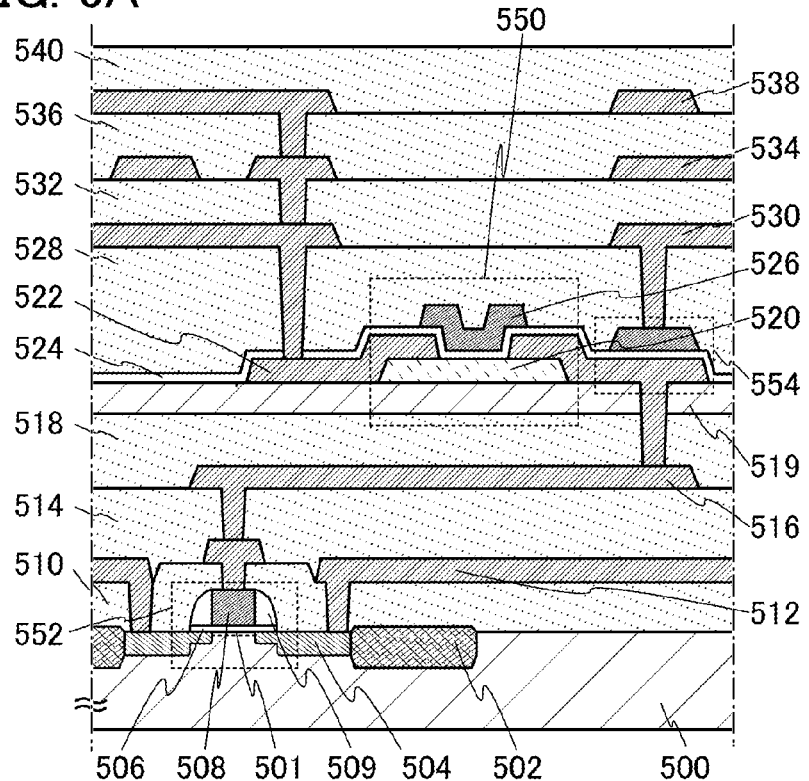
FIGS. 6A to 6C illustrate structures of a memory cell.

FIG. 6A illustrates an example of a cross-sectional view of part of the memory cell, in which a second transistor 552 using single crystal silicon for an active layer is provided on a single crystal silicon substrate 500 and a first transistor 550 using an oxide semiconductor material for an active layer is provided over the second transistor 552.

The second transistor 552 includes low-resistance regions 504 provided in the single crystal silicon substrate 500 and functioning as a source and a drain, a channel formation region 501 located in the single crystal silicon substrate 500 and sandwiched between the low-resistance regions 504, a gate insulating film 506 over the channel formation region 501, and a gate electrode 508 provided over the channel formation region 501 with the gate insulating film 506 interposed therebetween.

The second transistor 552 is separated from an adjacent transistor by a separation layer 502 that is provided in the single crystal silicon substrate 500. The low-resistance regions 504 of the second transistor 552 are electrically connected to low-resistance regions (not illustrated) of the adjacent transistor through a conductive film 512 provided over an interlayer film 510 that covers the second transistor 552. Further, side surfaces of the gate electrode 508 are covered with a sidewall insulating film 509.

Materials and formation methods for the separation layer 502, the low-resistance regions 504, the gate insulating film 506, the gate electrode 508, the sidewall insulating film 509, the interlayer film 510, and the conductive film 512 are not particularly limited, and known techniques can be used.

The first transistor 550 includes an oxide semiconductor film 520 provided over an insulating film 519, a conductive film 522 electrically connected to the oxide semiconductor film 520 and serving as the source and the drain of the first transistor 550, a gate insulating film 524 provided over the oxide semiconductor film 520, and a conductive film 526 which serves as a gate electrode and is provided over the oxide semiconductor film 520 with the gate insulating film 524 interposed therebetween.

Note that a film from which oxygen is released by heat treatment is preferably used as the insulating film 519. The reason for this is as follows: when oxygen vacancies exist in a channel formation region of the first transistor 550, electric charge is generated due to the oxygen vacancies in some cases. In general, part of oxygen vacancies in an oxide semiconductor film serves as a donor to release an electron which is a carrier. As a result, the threshold voltage of the transistor shifts in the negative direction.

When the insulating film 519 is a film from which oxygen is released by heat treatment (hereinafter, such a film is also referred to as an oxygen supply film), part of oxygen in the oxygen supply film can be released by the heat treatment; therefore, the oxygen can be supplied to the oxide semiconductor film and oxygen vacancies in the oxide semiconductor film can be filled, which can suppress the shift of the threshold voltage of the transistor in the negative direction. In particular, the oxygen supply film preferably contains oxygen which exceeds at least the stoichiometric composition. For example, in the case where silicon oxide is used for the oxygen supply film, a film of silicon oxide represented by $SiO_{2+\alpha}$ ($\alpha>0$) is preferably used. Note that a region containing a larger amount of oxygen than the stoichiometric composition (hereinafter referred to as "an oxygen-excess region" in some cases) may exist in at least part of the oxygen supply film.

Note that the aforementioned "film from which oxygen is released by heat treatment" refers to a film whose amount of oxygen which is released in thermal desorption spectroscopy (TDS) analysis and converted into oxygen atoms is greater than or equal to $1.0 \times 10^{19}$ atoms/cm$^2$, preferably greater than or equal to $3.0 \times 10^{19}$ atoms/cm$^2$, more preferably greater than or equal to $1.0 \times 10^{20}$ atoms/cm$^2$, and still further preferably greater than or equal to $3.0 \times 10^{20}$ atoms/cm$^2$.

A method for measuring the amount of released oxygen using TDS analysis will be described below.

The amount of released gas in the TDS analysis is proportional to the integral value of a spectrum with respect to elapsed time. Therefore, the amount of released gas can be calculated from the ratio between the integral value of a measured spectrum and the reference value of a standard sample. The reference value of a standard sample refers to the ratio of the density of a predetermined atom contained in a sample to the integral value of a spectrum.

For example, the number of released oxygen molecules ($N_{O2}$) from an insulating film can be found according to Formula 1 with the TDS analysis results of a silicon wafer containing hydrogen at a predetermined density, which is the standard sample, and the TDS analysis results of the insulating film. Here, all spectra having a mass-to-charge ratio (M/z) of 32 which are obtained by the TDS analysis are assumed to originate from an oxygen molecule. $CH_3OH$, which is given as a gas where M/z=32, can be ignored because it is unlikely to be present. Further, an oxygen molecule including an oxygen atom where M/z=17 or 18, which is an isotope of an oxygen atom, is also not taken into consideration because the proportion of such a molecule in the natural world is minimal.

Formula 1

$N_{H2}$ is the value obtained by conversion of the number of hydrogen molecules desorbed from the reference sample into density. $S_{H2}$ is the integral value of a spectrum with respect to elapsed time of the reference sample which is analyzed by TDS. Here, the reference value of the reference sample is expressed by $N_{H2}/S_{H2}$. $S_{O2}$ is the integral value of a spectrum with respect to elapsed time of the reference sample which is analyzed by TDS. $\alpha$ is a coefficient affecting the spectrum intensity in the TDS. For details of Formula (1), Japanese Published Patent Application No. H6-275697 is referred to. Note that the amount of released oxygen is measured with a thermal desorption spectroscopy apparatus manufactured by ESCO Ltd., EMD-WA1000S/W using a silicon wafer containing hydrogen atoms at $1 \times 10^{16}$ atoms/cm$^3$ as the reference sample.

Further, in the TDS, part of oxygen is detected as an oxygen atom. The ratio between oxygen molecules and oxygen atoms can be calculated from the ionization rate of oxygen molecules. Note that since the above α includes the ionization rate of oxygen molecules, the number of released oxygen atoms can be estimated through the evaluation of the number of the released oxygen molecules.

Note that $N_{O2}$ is the number of released oxygen molecules. When the number of released oxygen molecules is converted into the number of released oxygen atoms, the number of released oxygen atoms is twice the number of released oxygen molecules.

Further, in the case where the hydrogen concentration in the oxygen supply film is $7.2\times10^{20}$ atoms/cm$^2$ or higher, variations in initial characteristics of transistors are increased, the channel length dependence of electrical characteristics of a transistor is increased, and a transistor is significantly degraded in the BT stress test; therefore, the hydrogen concentration in the insulating film containing excess oxygen is set to lower than $7.2\times10^{20}$ atoms/cm$^2$. In other words, the hydrogen concentration in the oxide semiconductor film is preferably lower than or equal to $5\times10^{19}$ atoms/cm$^2$, and the hydrogen concentration in the insulating film containing excess oxygen is preferably lower than $7.2\times10^{20}$ atoms/cm$^2$.

Note that in the case where oxygen is supplied from the oxygen supply film to the oxide semiconductor film by heat treatment, it is preferable that a film (hereinafter, also referred to as a barrier film) having a low oxygen or water vapor permeability (also referred to as a low moisture permeability) be formed under the oxygen supply film (that is, on a surface of the oxygen supply film opposite to the surface in contact with the oxide semiconductor film) so that oxygen released from the oxygen supply film can be supplied to the oxide semiconductor film efficiently. For example, under the oxygen supply film, an aluminum oxide film, an aluminum oxynitride film, or an aluminum nitride oxide film may be formed as a barrier film. In the case of using an aluminum oxide film, the aluminum oxide film preferably has a high density (film density of higher than or equal to 3.2 g/cm$^3$, preferably higher than or equal to 3.6 g/cm$^3$).

An oxide semiconductor material used for the oxide semiconductor film 520 contains at least indium (In). In particular, In and zinc (Zn) are preferably contained. In addition, as a stabilizer for reducing the variation in electrical characteristics of a transistor using the oxide, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is a natural number) may be used.

A structure of the oxide semiconductor film will be described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, a change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower, and more preferably −120° C. or lower is used.

By increasing the substrate heating temperature during the deposition, migration of a sputtered particle is likely to occur after the sputtered particle reaches the substrate. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate, so that a flat plane of the sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based oxide target will be described below.

The In—Ga—Zn-based oxide target, which is polycrystalline, is made by mixing InO$_X$ powder, GaO$_Y$ powder, and ZnO$_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of InO$_X$ powder to GaO$_Y$ powder and ZnO$_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Further, since oxygen vacancy in the oxide semiconductor film 520 is preferably reduced as much as possible, it is preferable that the oxide semiconductor film 520 be deposited with a deposition atmosphere in which an oxygen gas accounts for a large proportion; therefore, it can be said that it is preferable to use a sputtering apparatus into which oxygen can be introduced and in which the gas flow rate can be adjusted.

Further, when the oxide semiconductor film 520 contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Accordingly, the concentration of hydrogen in the oxide semiconductor film 520 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, and further more preferably lower than or equal to $1\times10^{16}$ atoms/cm$^3$. Note that the concentration of hydrogen in the oxide semiconductor film 520 is measured by secondary ion mass spectrometry (SIMS).

For the above-described reason, it is preferable that the gas used for deposition of the oxide semiconductor film 520 do not contain an impurity such as water, hydrogen, a hydroxyl group, or hydride. Further, it is preferable to use a gas having a purity greater than or equal to 6N, preferably greater than or equal to 7N (i.e., the impurity concentration in the gas is less than or equal to 1 ppm, preferably less than or equal to 0.1 ppm).

Further, in deposition of the oxide semiconductor film 520, in order to remove moisture (including water, water vapor, hydrogen, a hydroxyl group, or hydroxide) in the deposition chamber, an entrapment vacuum pump such as a cryopump, an ion pump, or a titanium sublimation pump is preferably used. The evacuation unit may be a turbo molecular pump provided with a cold trap. From the deposition chamber which is evacuated with a cryopump, a hydrogen atom, a compound containing a hydrogen atom such as water ($H_2O$) (preferably, also a compound containing a carbon atom), and the like are removed, whereby the concentration of impurities such as hydrogen or moisture in the oxide semiconductor film 520 formed in the deposition chamber can be reduced.

Note that the oxide semiconductor film 520 may have a structure in which a plurality of oxide semiconductor films are stacked. For example, the oxide semiconductor film 520 may be a stack of the first oxide semiconductor film, the second oxide semiconductor film, and the third oxide semiconductor film, which each have different compositions. For example, the first oxide semiconductor film and the third oxide semiconductor film may be formed using a three-component metal oxide, and the second oxide semiconductor film may be formed using a two-component metal oxide. In the case where the materials containing the same components are used, the second oxide semiconductor film can be formed over the first oxide semiconductor film using a crystal layer of the first oxide semiconductor film as a seed, which facilitates crystal growth of the second oxide semiconductor film. The same applies to the third oxide semiconductor film. In addition, in the case where the materials including the same components are used, it is also possible to achieve a good interface property such as adhesion or electrical characteristics.

Further, the constituent elements of the first oxide semiconductor film, the second oxide semiconductor film, and the third oxide semiconductor film may be the same and the compositions of the constituent elements of the first oxide semiconductor film, the second oxide semiconductor film, and the third oxide semiconductor film may be different from one another. For example, the first oxide semiconductor film and the third oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film and the third oxide semiconductor film may each have an atomic ratio of In:Ga:Zn=1:3:2, and the second oxide semiconductor film may have an atomic ratio of In:Ga:Zn=3:1:2.

At this time, the second oxide semiconductor film preferably contains more In than Ga. Further, the first oxide semiconductor film and the third oxide semiconductor film preferably contain In and Ga at a proportion of In≤Ga.

In an oxide semiconductor, the s orbital of heavy metal mainly contributes to carrier transfer, and overlap of the s orbitals is likely to increase when the In content in the oxide semiconductor is increased. Therefore, an oxide having a composition of In>Ga has higher mobility than an oxide having a composition of In≤Ga. Further, in Ga, the formation energy of oxygen vacancies is larger and thus oxygen vacancies are less likely to occur, than in In; therefore, the oxide having a composition of In≤Ga has more stable characteristics than the oxide having a composition of In>Ga.

An oxide semiconductor having a composition of In>Ga is applied to the second oxide semiconductor film which is not in contact with the insulating film 519 or the gate insulating film 524, and an oxide semiconductor having a composition of In≤Ga is applied to the first oxide semiconductor film or the third oxide semiconductor film which is in contact with the insulating film 519 or the gate insulating film 524, whereby mobility and reliability of a transistor can be increased.

A material and formation method for the gate insulating film 524 and the conductive film 526 serving as the gate electrode are not particularly limited and known techniques can be used.

The gate insulating film 524 may be formed by depositing an insulating material (e.g., silicon nitride, silicon nitride oxide, silicon oxynitride, or silicon oxide) with use of high-density plasma, for example.

Note that at least a film in contact with the gate insulating film 524 is preferably a film of a material having a work function higher than that of a material of the oxide semiconductor film 520. As the film, a metal oxide film containing nitrogen such as an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film, or the like can be used. These films each have a work function higher than or equal to 5 eV (electron volts), preferably higher than or equal to 5.5 eV (electron volts); thus, when these are used for the gate electrode, the threshold voltage of the transistor can be positive. Accordingly, what is called a normally-off switching element can be provided. In this embodiment and the like, the first transistor 550 corresponds to the normally-off switching element.

A capacitor 554 can be formed by stacking the conductive film 522, the gate insulating film 524, and the conductive film 526.

As illustrated in FIG. 6A, a plurality of interlayer films (an interlayer film 514 and 518 in FIG. 6A) and a conductive film (a conductive film 516 in FIG. 6A) may be formed between the layer where the second transistor 552 is formed and the layer where the first transistor 550 is formed.

Further, as illustrated in FIG. 6A, a plurality of interlayer films (interlayer films 528, 532, 536, and 540 in FIG. 6A) and a plurality of conductive films (conductive films 530, 534, and 538 in FIG. 6A) may be formed over the first transistor 550.

Since the first transistor 550 is a transistor using an oxide semiconductor material, conductive films (or wiring layers) can be provided over and under the transistor using an oxide semiconductor material, which results in an increase in the degree of flexibility in the circuit configuration.

Note that the first transistor 550 described above has what is called a top-gate top-contact (TGTC) structure in which the conductive film 522 serving as the source or the drain and the conductive film 526 serving as the gate electrode are formed over the oxide semiconductor film 520; however, the structure of the first transistor 550 is not limited to this.

For example, the first transistor 550 may have a top-gate bottom-contact (TGBC) structure in which the conductive film 522 serving as the source or the drain is formed under the oxide semiconductor film 520.

Figure 6B:
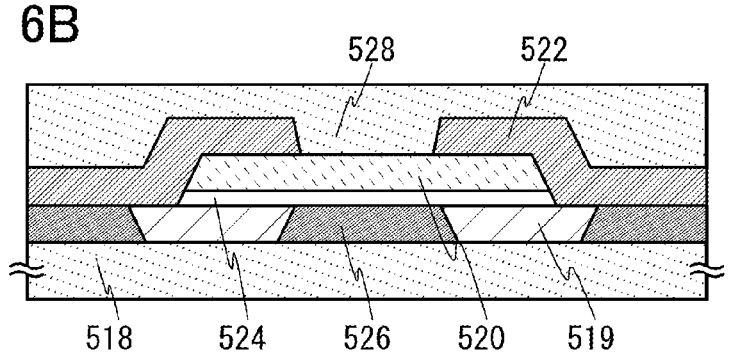

Further, as illustrated in FIG. 6B, the first transistor 550 may have a bottom-gate top-contact (BGTC) structure in which the conductive film 526 serving as the gate electrode is formed under the oxide semiconductor film 520 with the gate insulating film 524 interposed therebetween. Alternatively, the first transistor 550 may have a bottom-gate bottom-contact (BGBC) structure in which the conductive film 522 serving as the source or the drain is formed under the oxide semiconductor film 520 in FIG. 6B.

Figure 6C:
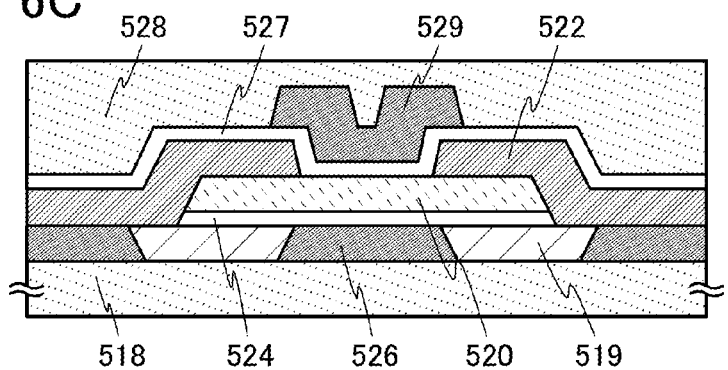

Furthermore, as illustrated in FIG. 6C, the first transistor 550 may have a structure in which a conductive film 529 serving as a back gate electrode is formed over the oxide semiconductor film 520 with an insulating film 527 interposed therebetween. With the structure including the conductive film 529, even when the first transistor 550 is in a normally-on state (which means that the transistor is on when application of a potential by a power source is not conducted), by appropriately applying a voltage to the conductive film 529, the threshold voltage of the first transistor 550 can be shifted to keep the first transistor 550 in a normally-off state (which means that the transistor is off when application of a potential by a power source is not conducted).

The structures, methods, and the like shown in this embodiment can be combined with any of those shown in the other embodiments, as appropriate.

This application is based on Japanese Patent Application Ser. No. 2012-140616 filed with Japan Patent Office on Jun. 22, 2012, the entire contents of which are hereby incorporated by reference.

What is claimed is:

1. A semiconductor device comprising:
   a main storage unit comprising at least a first operating system and a second operating system, wherein the first operating system comprises a first hibernation utility and first data, and the second operating system comprises a second hibernation utility and second data; and
   a memory comprising at least a first region and a second region,
   wherein the first hibernation utility is configured to save the first data to the first region in first hibernation during which the first operating system is stopped while the first data is retained in the memory,
   wherein the second hibernation utility is configured to determine whether the second data shares a common block with the first data saved to the first region in second hibernation during which the second operating system is stopped while the second data is retained in the memory,
   wherein the second hibernation utility is configured not to save the common block of the second data to the first region, and
   wherein the second hibernation utility is configured to record the information of the common block in the second region.

2. The semiconductor device according to claim 1, wherein the common block between the first data and the second data is in a kernel area of the first operating system and the second operating system.

3. The semiconductor device according to claim 1, wherein the first hibernation utility is configured to write back the first data saved to the first region to the first operating system in first resumption for starting the first operating system.

4. The semiconductor device according to claim 1, wherein the second hibernation utility is configured to write back the common block between the first data and the second data saved to the first region to the second operating system in second resumption for starting the first operating system.

5. The semiconductor device according to claim 1, wherein the first hibernation utility is configured to delete the first data in the first operating system after the first hibernation.

6. The semiconductor device according to claim 1, wherein the second hibernation utility is configured to delete the common block between the first data and the second data in the second operating system after the second hibernation.

7. A method for driving a semiconductor device comprising the steps of:
   saving first data in a first operating system to a first region of a memory by a first hibernation utility in first hibernation during which the first operating system is stopped while the first data is retained in the memory;
   determining whether second data in a second operating system shares a common block with the first data saved to the first region by a second hibernation utility in second hibernation during which the second operating system is stopped while the second data is retained;
   not saving the common block of the second data to the first region in case where there is the common block; and
   recording the information of the common block in a second region of the memory in case where there is the common block.

8. The method for driving the semiconductor device according to claim 7, wherein the common block between the first data and the second data is in a kernel area of the first operating system and the second operating system.

9. The method for driving the semiconductor device according to claim 7, wherein the first hibernation utility is configured to write back the first data saved to the first region to the first operating system in first resumption for starting the first operating system.

10. The method for driving the semiconductor device according to claim 7, wherein the second hibernation utility is configured to write back the common block between the first data and the second data saved to the first region to the second operating system in second resumption for starting the first operating system.

11. The method for driving the semiconductor device according to claim 7, wherein the first hibernation utility is configured to delete the first data in the first operating system after the first hibernation.

12. The method for driving the semiconductor device according to claim 7, wherein the second hibernation utility is configured to delete the common block between the first data and the second data in the second operating system after the second hibernation.

* * * * *